US012626888B2

(12) United States Patent
Sacco et al.

(10) Patent No.: US 12,626,888 B2
(45) Date of Patent: May 12, 2026

(54) VAPORIZER AND ION SOURCE

(71) Applicant: Nissin Ion Equipment Co., Ltd., Koka City (JP)

(72) Inventors: George Sacco, Groveland, MA (US); Sami K. Hahto, Nashua, NH (US)

(73) Assignee: NISSIN ION EQUIPMENT CO., LTD.

( * ) Notice: Subject to any disclaimer, the term of this patent is extended or adjusted under 35 U.S.C. 154(b) by 344 days.

(21) Appl. No.: 18/585,499

(22) Filed: Feb. 23, 2024

(65) Prior Publication Data

US 2025/0273437 A1    Aug. 28, 2025

(51) Int. Cl.
     *C23C 14/48*        (2006.01)
     *H01J 37/32*        (2006.01)

(52) U.S. Cl.
     CPC ........ *H01J 37/32412* (2013.01); *C23C 14/48* (2013.01); *H01J 37/32055* (2013.01)

(58) Field of Classification Search
     CPC .......... H01J 37/32412; H01J 37/32055; C23C 14/48
     See application file for complete search history.

(56) References Cited

U.S. PATENT DOCUMENTS

| | | | | |
|---|---|---|---|---|
| 5,977,552 A | 11/1999 | Foad | | |
| 7,655,932 B2 * | 2/2010 | Hatem | .................... | H01J 27/02 |
| | | | | 700/121 |
| 11,854,760 B2 * | 12/2023 | Wright | .................... | H01J 27/22 |
| 2012/0048723 A1 * | 3/2012 | Chaney | ............... | H01J 37/3171 |
| | | | | 204/192.12 |
| 2023/0326702 A1 | 10/2023 | Hahto et al. | | |

* cited by examiner

*Primary Examiner* — Sean Luck
(74) *Attorney, Agent, or Firm* — Sughrue Mion, PLLC

(57) ABSTRACT

An ion source includes a vaporizer, an arc chamber, and an extraction electrode. The vaporizer includes a crucible and a heater. The crucible stores a solid material. The heater heats the crucible. The crucible has an interior space formed by a wall, an inlet connected to the wall that releases a reactive gas into the interior space, and an outlet connected to the wall that releases the reactive gas and a vapor of the reaction product generated by a reaction between the solid material and the reactive gas from the interior space. The interior space narrows toward at least one of the inlet and the outlet.

14 Claims, 16 Drawing Sheets

VAPORIZER AND ION SOURCE

BACKGROUND

1. Field

The present disclosure relates to a vaporizer, and an ion source having the vaporizer.

2. Description of Related Art

Silicon carbide (SiC) devices are expected to be used in high-voltage and high-temperature applications such as electric vehicles, railways and power plants, and are featured as one of the items to realize a low-carbon society. The manufacturing process for SiC devices is similar to that of conventional silicon devices in that both use an ion implantation process.

In the ion implantation process for SiC devices, nitrogen or phosphorus ions are implanted as an N-type dopant and aluminum or boron ions are implanted as a P-type dopant into a SiC wafer in the production of a PN junction.

However, since there is no stable gas at room temperature for ion implantation of aluminum ions, plasma generation and ion beam extraction based on a solid material containing aluminum are performed.

As a related art method, vaporizing an aluminum-containing solid material (including those in powder form) has been utilized to generate plasma containing aluminum ions.

SUMMARY

According to an aspect of one or more embodiments, there is provided a vaporizer comprising a crucible configured to receive a solid material; and a heater that heats the crucible. The crucible includes a wall forming an interior space of the crucible, an inlet connected to the wall that releases a reactive gas into the interior space, and an outlet connected to the wall that releases the reactive gas and a vapor of a reaction product generated by a reaction between the solid material and the reactive gas from the interior space. The interior space of the crucible narrows toward at least one of the inlet and the outlet.

According to another aspect of one or more embodiments, there is provided a vaporizer comprising a crucible configured to receiving a solid material, the crucible comprising an inlet for receiving a reactive gas into the crucible, an outlet through which the reactive gas and vapor are released from the crucible, and a wall that connects the inlet to the outlet; and a heater that heats the crucible. A first portion of the wall extends in parallel to a direction connecting the inlet and the outlet, a second portion of the wall connects the first portion to the inlet, a third portion of the wall connects the first portion to the outlet, and at least one of a dimension of the second portion decreases toward the inlet and a dimension of the third portion decreases toward the outlet.

According to yet another aspect of one or more embodiments, there is provided an ion source comprising the vaporizer as recited above, an arc chamber that generates a plasma from the vapor supplied from the vaporizer, and an extraction electrode that extracts an ion beam from the plasma.

BRIEF DESCRIPTION OF THE DRAWINGS

The above and/or other aspects will become apparent and more readily appreciated from the following description of various embodiments, taken in conjunction with the accompanying drawings, in which:

FIGS. 6, 7, 9, 11-16 illustrate schematic cross-sectional views of examples of a crucible of the ion source, according to various embodiments.

DETAILED DESCRIPTION

As used in this specification, the phrase "at least one of A and B" includes within its scope "only A", "only B", and "A and B", and the phrase "at least one of A or B" includes within its scope "only A", "only B", and "A and B".

As discussed above, in the ion implantation process for SiC devices, nitrogen or phosphorus ions are implanted as an N-type dopant and aluminum or boron ions are implanted as a P-type dopant into a SiC wafer in the production of a PN junction.

Nitrogen gas, phosphine, phosphorus trifluoride or boron trifluoride are stable at room temperature. Therefore, nitrogen gas, phosphine, phosphorus trifluoride or boron trifluoride are used to generate plasma, and an ion beam is extracted from the generated plasma for ion implantation of nitrogen, phosphorus or boron ions to a SiC wafer.

On the other hand, since there is no stable gas at room temperature for ion implantation of aluminum ions, plasma generation and ion beam extraction based on a solid material containing aluminum are performed.

In the related art method of generating plasma from the aluminum-containing solid material, the aluminum-containing solid material is placed in a crucible. Vaporizing an aluminum-containing solid material (including those in powder form) has been utilized to generate plasma containing aluminum ions. In this related art method, aluminum-containing solid material is placed in a crucible of a vaporizer, and vapor is generated from the solid material by heating the crucible. The generated vapor is used to generate plasma containing aluminum ions.

As an improvement of the related art method, George Sacco et. al. propose a new vaporizer as described in U.S. patent application Ser. No. 17/714,491, filed Apr. 6, 2022, now U.S. Patent Application Publication No. 2023/326702 for "VAPORIZER, ION SOURCE AND METHOD FOR GENERATING ALUMINUM-CONTAINING VAPOR" and U.S. patent application Ser. No. 17/945,705, filed Sep. 15, 2022 for "VAPORIZER, ION SOURCE AND METHOD FOR GENERATING ALUMINUM-CONTAINING VAPOR", the entire contents of each of these U.S. patent applications are herein incorporated by reference in their entireties.

In these vaporizers, a reactive gas is supplied to the crucible. In the crucible, the reactive gas reacts with the solid material to produce reaction products. The generated reaction products are vaporized by heating the crucible and are supplied to an arc chamber. In the arc chamber, a plasma containing aluminum ions is generated from the supplied vapor and is extracted as an ion beam through extraction electrodes.

One of the factors in improving productivity in the semiconductor device manufacturing process is to lengthen an operation time of the vaporizer, i.e., to extend a life of the vaporizer. An approach for extending the operation time of the vaporizer is to increase a size of the solid material placed in the crucible. However, simply increasing the size of the solid material may hinder the operation of the vaporizer.

Figure 1:
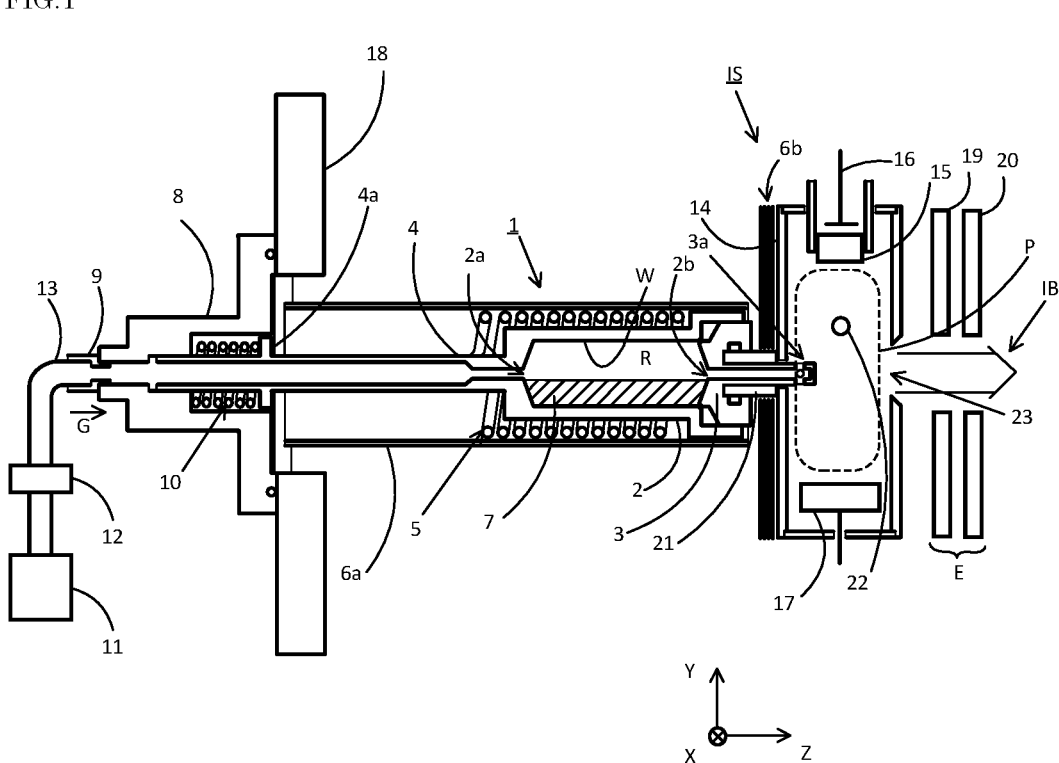
FIG. 1 is a schematic cross-sectional view of an example of an ion source, according to some embodiments.

FIG. 1 shows a schematic cross section of an example of an ion source IS, according to some embodiments. The ion source IS is illustrated as an indirectly heated cathode (IHC) ion source by way of example. A filament 16 heats a cathode 15 and the cathode 15 emits ionizing electrons inside of an arc chamber 14. A reflecting electrode 17 is positioned opposite the cathode 15 to repel electrons from the cathode 15. An external electromagnet, which is not shown in FIG. 1, generates a magnetic field along a direction connecting the cathode 15 and the reflecting electrode 17.

Aluminum-containing vapor is supplied from a vaporizer 1 to the inside of arc chamber 14. Plasma P is generated in the arc chamber 14 based on the aluminum-containing vapor. An ion beam IB or ion beams containing aluminum ions is extracted through an ion extraction aperture 23 of the arc chamber 14 by extraction electrodes E. In FIG. 1, two circularly shaped extraction electrodes E with a hole through which the ion beam IB passes in the center are illustrated, but the number and shape of the extraction electrodes E is exemplary.

In some embodiments, the number of extraction electrodes may be more or less than two. In general, the number of extraction electrodes may be modified according to a configuration of an ion source.

The vaporizer 1 includes a crucible 2. The crucible 2 in FIG. 1 is a cylindrical member that is long in one direction. For example, a central axis of the crucible 2 may extend along its longitudinal direction (e.g., along the Z axis in FIG. 1). An outlet 2b for supplying aluminum-containing vapor and reactive gas to the arc chamber 14 is at one end of the crucible 2 in the longitudinal direction. An inlet 2a for supplying the reactive gas such as chlorine-containing gas, into the crucible 2 is at the other end of the crucible 2 in the longitudinal direction. A part of the crucible 2 is formed by a first nozzle 3 at the outlet 2b side. Inner walls W of the crucible 2 define an interior space R and are connected to both the inlet 2a and the outlet 2b.

In some embodiments, the chlorine-containing gas is, for example, chlorine gas ($Cl_2$) or hydrogen chloride gas (HCl).

The first nozzle 3 is removably attached to the crucible 2. Various methods (e.g., fitting and/or screwing) can be used to attach the first nozzle 3 to the crucible 2. In FIG. 1, the crucible 2 and a second nozzle 4 for supplying reactive gas into the crucible 2 are formed in one piece.

The first nozzle 3 and the second nozzle 4 each have an elongated cylindrical shape. In some embodiments, the first nozzle 3, the second nozzle 4, and the crucible 2 are made of graphite. However, graphite is only one example, and in some embodiments, other materials may be used.

In FIG. 1, arrow G shows a flow of reactive gas supplied to the crucible 2. The reactive gas passes from a gas supply source 11 through a valve 12, through the second nozzle 4, the crucible 2, and the first nozzle 3 in that order, and enters the arc chamber 14. The reactive gas reacts with a solid material 7 heated to a high temperature. In some embodiments, the solid material 7 may be an aluminum-containing solid material. This reaction produces reaction products such as aluminum chloride ($AlCl_3$). The generated reaction products are vaporized in the crucible 2 to produce aluminum-containing vapor containing aluminum particles. The aluminum-containing vapor and chlorine-containing gas are supplied from the crucible 2 to the arc chamber 14 via the first nozzle 3.

In some embodiments, the solid material 7 is pure aluminum with a purity of 99.90% or higher. Pure aluminum increases the percentage of aluminum in the aluminum-containing vapor compared to other materials. As a result, the ion beam current of the ion beam containing aluminum ions extracted from the ion source IS is increased. However, the solid material 7 is not limited to pure aluminum. In some embodiments, aluminum nitride, aluminum oxide and/or other aluminum-containing solid materials may be used. As discussed further below, in some embodiments, the solid material 7 may include elements other than aluminum.

As shown in FIG. 1, a supply of reactive gas to the second nozzle 4 may be via a fitting member 9 that is in-fitted to the second nozzle 4. For example, in some embodiments, the reactive gas may be supplied from a gas supply source 11 configured to supply reactive gas. For example, the valve 12 may be a mass flow controller and may be connected to a pipe 13 that connects to the gas supply source 11 to the fitting member 9 and the valve 12 may control the flow rate of the reactive gas. However, the specific configuration for gas supply is not limited as long as the reactive gas can be supplied to the fitting member 9.

In some embodiments, the temperature of the crucible 2 is a melting point or more than a melting point of the solid material 7 to further a generation of reaction products and vaporizing the reaction products and to prevent clogging of the first nozzle 3 and the second nozzle 4.

In some embodiments, the solid material 7 may be in the form of a powder, pellets, and/or a block. In some embodiments, the solid material 7 may be, for example, pure aluminum, aluminum nitride, or aluminum oxide, or other aluminum containing materials including a powder. However, embodiments are not limited to this and, in some embodiments, the solid material 7 may be changed depending on a metal ion species to be generated.

An end portion 3a of the first nozzle 3, opposite from the end of the first nozzle 3 attached to the crucible 2, protrudes into the arc chamber 14. In some embodiments, the end portion 3a has holes for vapor supply in four orthogonal directions so that aluminum-containing vapor may be diffused and supplied in multiple directions inside of the arc chamber 14. However, embodiments are not limited thereto and, in some embodiments, fewer or more holds may be provided in various directions.

A heater 5 is wound around a periphery of the crucible 2. The solid material 7 is heated to a high temperature by the heater 5 and reacts with the reactive gas to generate the aluminum-containing vapor. In some embodiments, the heater 5 may be a coil heater 5. However, embodiments are not limited thereto and, in some embodiments, the heater 5 may have a different configuration such as a plate or other filament. A first heat shield 6a is placed around a periphery of the heater 5 to block heat radiation from the heater 5.

During operation, as the heater 5 heats the crucible 2 and the solid material 7 within the crucible 2, the temperature within the crucible 2 may vary from an ion source end of the crucible 2 (i.e., an end at which the second nozzle 4 is provided) to an opposite end of the crucible 2 (i.e., an end at which the first nozzle 3 is provided) due, at least in part, to heat that is generated by the arc chamber 14 and transferred to an end of the crucible 2 near the arc chamber 14.

Accordingly, in some embodiments, the ion source IS may be provided with a second heat shield 6b as illustrated in FIG. 1. The second heat shield 6b may be provided between the crucible 2 and a side wall of the arc chamber 14 that faces the crucible 2, and may extend radially outward from the first nozzle 3 and parallel to the side wall of the arc chamber 14. In some embodiments, the second heat shield 6b may be secured by screws or other fittings. The second heat shield 6b may function to prevent heat from the arc chamber 14 from heating the end of the crucible 2 that is near the arc chamber 14.

In some embodiments, the second nozzle 4 may have a large diameter section 4a. In some embodiments, a flange 8 may be provided to attach the vaporizer 1 to an ion source flange 18. A coil spring 10 may be provided between the flange 8 and the large diameter section 4a of the second nozzle 4. The coil spring 10 forces the vaporizer 1 against a side wall of the arc chamber 14 to prevent aluminum-containing vapor and/or the reactive gas from leaking out between the first nozzle 3 and the arc chamber 14. In some embodiments, one or more gaskets (not shown) may also be provided between the vaporizer 1 and the side wall of the arc chamber 14 to prevent gas leakage between the first nozzle 3 and the arc chamber 14, and/or one or more gaskets (not shown) may be provided between the vaporizer 1 and the second heat shield 6b to prevent gas leakage between the vaporizer 1 and the second heat shield 6b.

In some embodiments, a damper, for example, a spring clip in the form of a snap ring, may be attached to the first nozzle 3 in order to avoid excess pressure by the elastic force of the coil spring 10. In some embodiments, a damper, for example, a spring clip, may be provided between the large diameter section 4a of the second nozzle 4 and the inner wall of the heat shield 6a in order to prevent the excess pressure by the elastic force of the coil spring 10. In some embodiments, one or all of one or more gaskets, a snap ring, and/or a spring clip may be provided. It is noted that the gaskets, snap ring and spring clip are only examples and, in other embodiments, different or additional structures may be used to prevent excess pressure. In some embodiments, the ion source flange 18 may also indirectly support the arc chamber 14 and other components around the arc chamber 14 such as the filament 16 and the cathode 15 by supporting parts not shown in FIG. 1.

In some embodiments, the solid material 7 may fill only a portion of the interior of the crucible 2. For example, in some embodiments, a top edge of the aluminum-containing solid material 7 may coincide with a bottom edge of the vapor outlet 2a.

The above description is provided using an example of an IHC ion source. However, an IHC source is only one example embodiment and, in other embodiments, other types of ion sources such as a Bernas ion source and a Radio frequency inductively coupled plasma ion source, etc. may be used as the ion source IS.

As discussed above, heat transfer from the arc chamber 14 to the end of the crucible 2 occurs near the arc chamber 14, and accordingly, there may be a large temperature difference from one end of the crucible 2 to the other end of the crucible 2 such that it becomes difficult to achieve a stable vapor supply from the vaporizer 1 to the arc chamber 14. In some embodiments, the vaporizer 1 may include an insulator 21 that is provided to surround the first nozzle 3 that supplies the aluminum-containing vapor to the arc chamber 14. In some embodiments, the second heat shield 6b may be omitted and the vaporizer 1 may include the insulator 21. In some embodiments, the insulator 21 may be formed of alumina ($Al_2O_3$). In some embodiments, the insulator 21 may be formed of boron nitride (BN). However, the material of the insulator 21 is not limited to these examples and, in some embodiments, another material that provides heat insulation may be used.

The insulator 21 may insulate the first nozzle 3 and the vapor outlet 3a from the heat produced by the arc chamber 14. The insulator 21 may function to prevent heat from the arc chamber 14 from heating the first nozzle 3 and the end of the crucible 2 that is near the arc chamber 14.

Figure 2:
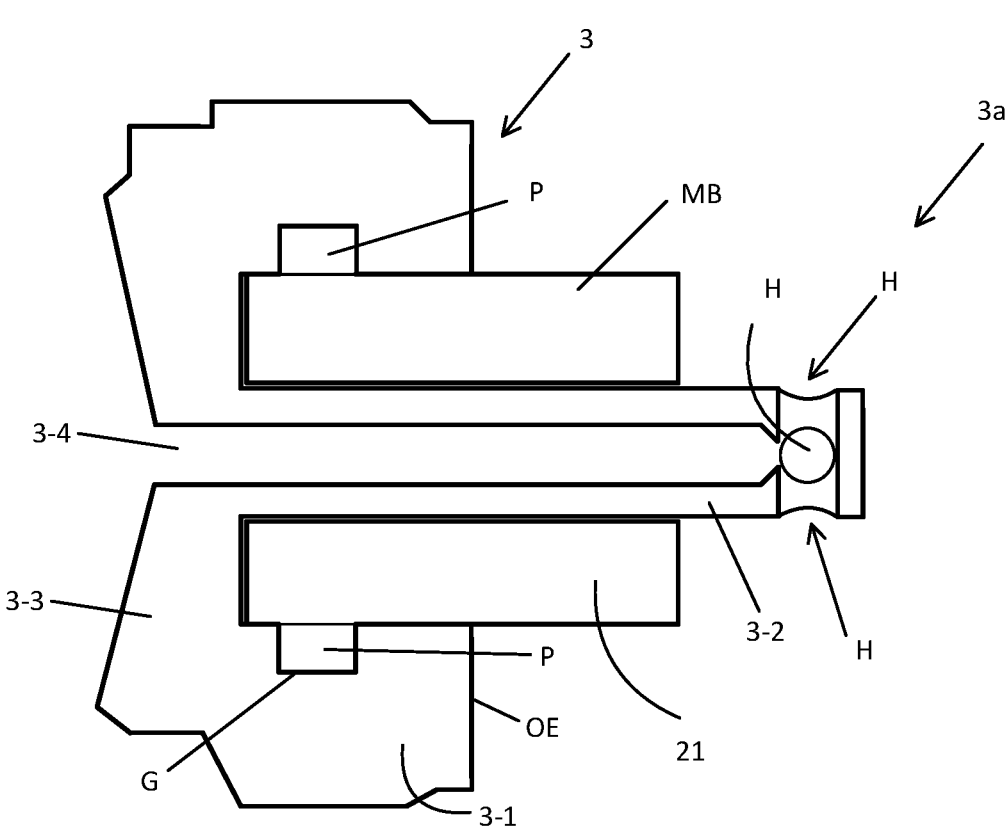
FIG. 2 illustrates an example of a first nozzle of the ion source, according to some embodiments.

FIG. 2 illustrates an example of the first nozzle 3 of the ion source IS, according to some embodiment. FIG. 2 illustrates a cross-section of an example of the first nozzle 3 of the ion source IS in FIG. 1 in more detail. The first nozzle 3 may have an annular shape symmetrical about a central axis of the first nozzle 3. In some embodiments, the first nozzle 3 may have a first portion 3-1 that includes an annular groove G therein, a second portion 3-2 that extends along a flow path 3-4, and a third portion 3-3 that connects the first portion 3-1 to the second portion 3-2. The flow path 3-4 communicatively connects the interior of the crucible 2 to the interior of the arc chamber 14, and provides a path for the reactive gas and the aluminum-containing vapor. The flow path 3-4 leads to apertures H at the end portion 3a of the first nozzle 3. In some embodiments, each aperture H is a round hole that connects the inside and outside of the first nozzle 3 on the front, back, left and right sides of the first nozzle 3, and thus the first nozzle 3 may supply the reactive gas and the aluminum-containing vapor into the arc chamber 14 in four directions. While four apertures are described with respect to FIGS. 1-2, the number of apertures H is not limited to four. In some embodiments, the number of apertures H may be less than four or greater than four. As the number of apertures increase, it may be possible to supply the aluminum-containing vapor to the arc chamber 14 in more directions.

As illustrated in FIG. 2, the insulator 21 may be provided to cover at least a portion of an outside surface of the second portion 3-2 of the first nozzle 3 and may contact an inner surface of the first portion 3-1. The insulator 21 may include a main body MB and projections P that each extend radially outward from the main body MB of the insulator 21.

Figure 3:
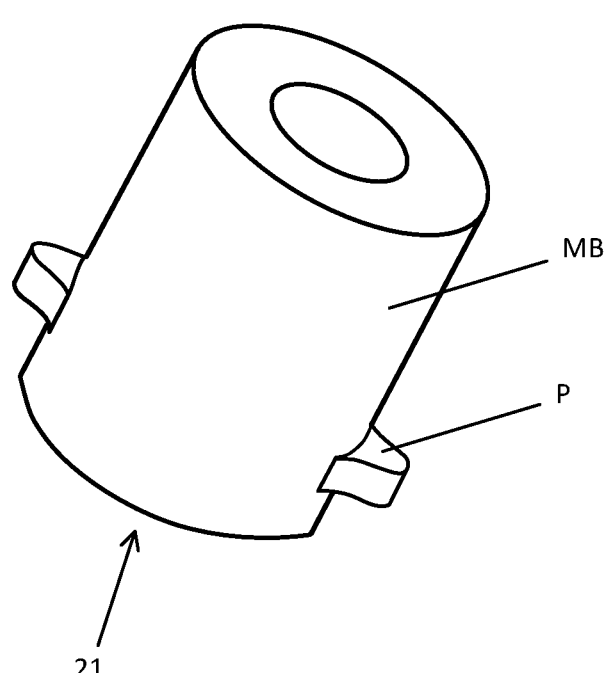
FIG. 3-5 illustrate an example of an insulator of the vaporizer, according to some embodiments.
Figure 4:
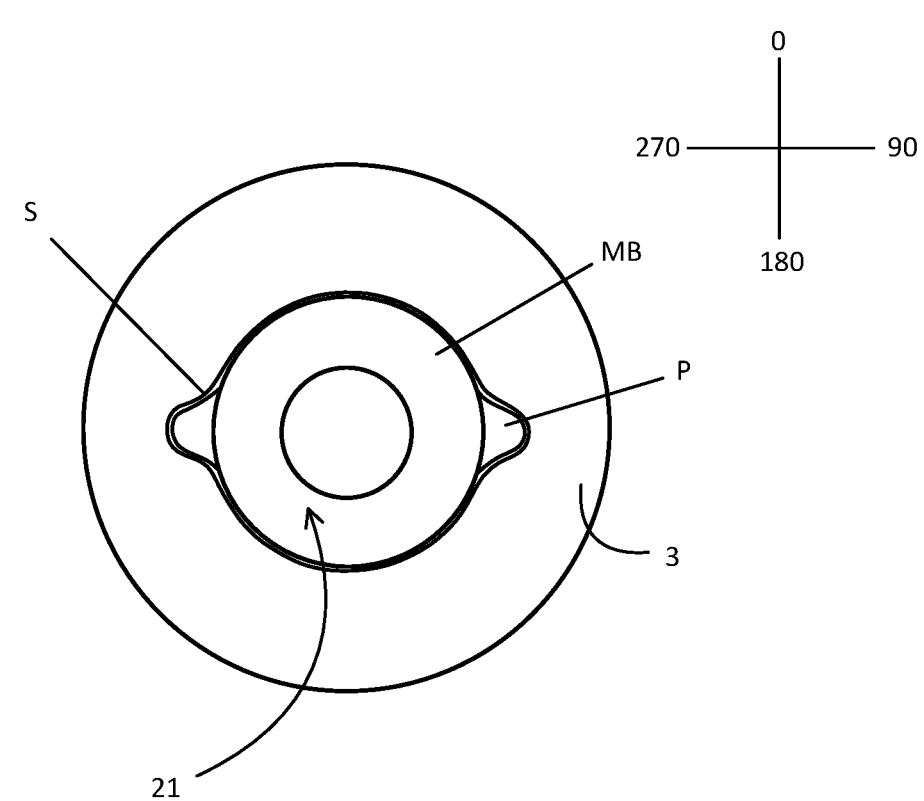
Figure 5:
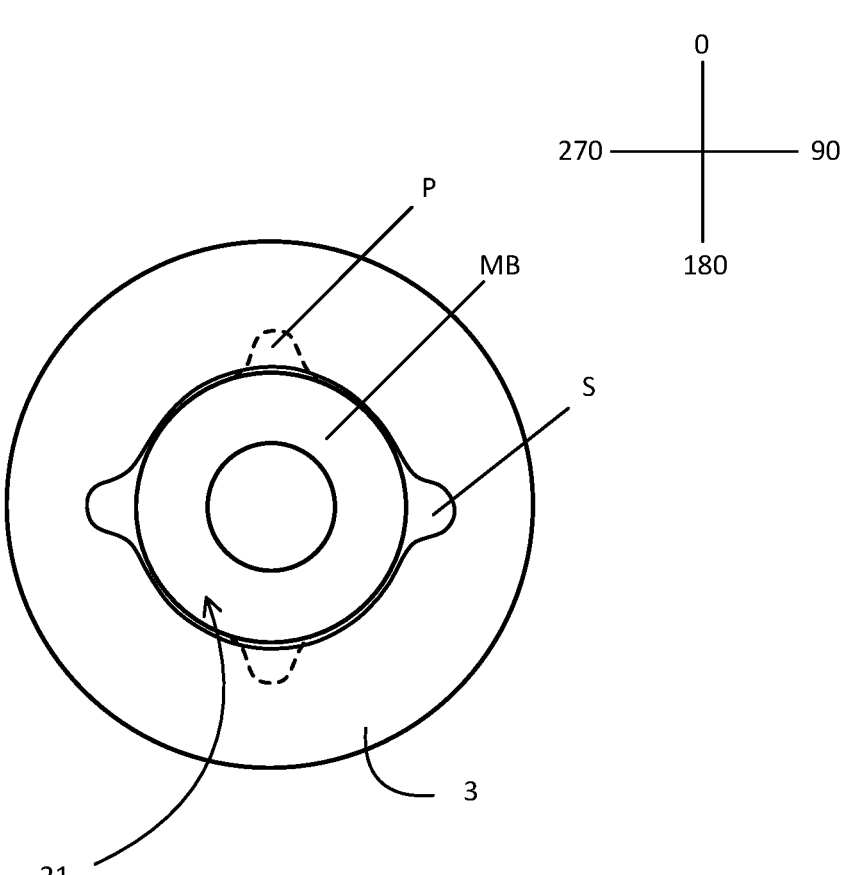

FIG. 3-5 illustrate an example of an insulator, according to some embodiments. FIG. 3 shows a perspective view of the insulator 21, FIG. 4 illustrates the insulator 21 fitted on the first nozzle 3 before rotation, and FIG. 5 illustrates the insulator 21 fitted on the first nozzle 3 after rotation.

As illustrated in FIGS. 3-5, the insulator 21 may comprise the main body MB that is generally cylindrical, and the projections P that project radially outward from the main body MB at a position along that main body MB that is closer to the crucible 2 than the arc chamber 14 when the insulator 21 is fitted on the first nozzle 3. In some embodiments, two projections P may be provided as illustrated in FIGS. 3-5. However, this is only an example, and in some embodiments, more than two projections P may be provided.

In some embodiments, the first portion 3-1 of the first nozzle 3 may have slots S that extend in an axial direction from an outer edge OE of the first portion 3-1 to the grooves G (see FIG. 2). The insulator 21 is slid onto the first nozzle 3 in a configuration in which the projections P are matched to the slots S (see FIG. 4) such that the projections P slide among the slots until the groove G is reached. The insulator 21 is then rotated such that the projections P slide circumferentially around the groove G (see FIG. 5) to secure the insulator 21 onto the first nozzle 3 so that the insulator 21 will not slide off the first nozzle 3. For example, as illustrated in FIG. 4, the slots S may be provided at 90 and 270 degrees, and the insulator 21 may be rotated 90 degrees clockwise such the projections P move to from 90 and 270 degrees in FIG. 4 to 0 and 180 degrees in FIG. 5 to secure the insulator 21 onto the first nozzle 3. In some embodiments, the groove G may be provided in two arc segments, one arc segment extending from 270 to 0 degrees and another arc segment extending from 90 to 180 degrees. However, this configuration of the groove G is only an example, and in some embodiments, the groove G may be an annular groove that extends 360 degrees around the first nozzle 3 and in other embodiments, the arc segments may be provided between different circumferential angles as long as the projections P of the insulator 21 may be rotated into place within the groove G to secure the insulator 21 onto the first nozzle 3.

Figure 6:
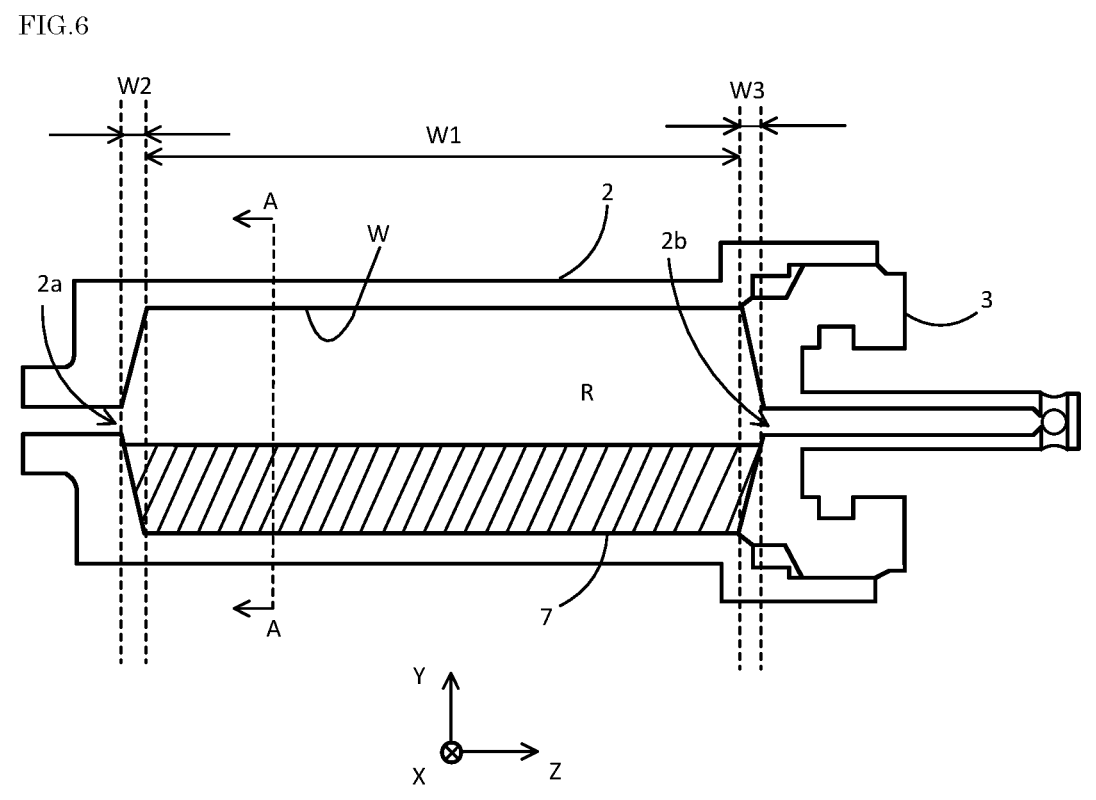

FIG. 6 is a schematic cross-sectional view of an example of a crucible 2, according to some embodiments. In FIG. 6—, like reference numbers refer to like elements in FIGS. 1-5 and a repeated description thereof is omitted for conciseness.

The wall W forming the interior space R of the crucible 2 comprises a portion of the crucible 2 and a portion of the first nozzle 3. The wall W is connected to the inlet 2a and outlet 2b in the longitudinal direction of the crucible 2 (illustrated, in Z-axis direction). The crucible 2 is cylindrical, extending in one direction, but may also be a square cylinder. The crucible 2 has a length direction and a width direction in mutually orthogonal directions. In the cross-sectional view of FIG. 6, the length direction of the crucible 2 is the Z-axis direction and the width direction of the crucible 2 is the Y-axis direction.

In the longitudinal direction of the crucible 2 (e.g., the Z-axis direction), the wall W forming the interior space R of the crucible 2 is divided into three portions. In the first portion W1, the wall W is extended parallel to the direction connecting the inlet 2a and the outlet 2b (e.g., the Z-axis direction), and the dimension of the wall W in the width direction (e.g., the Y-axis dimension) along the longitudinal direction of the crucible 2 is constant. In the second portion W2, which is adjacent to the first portion W1, the dimension in the width direction (e.g., the Y-axis dimension) of the wall W decreases toward the inlet 2a.

At the third portion W3 adjacent to the first portion W1, the width dimension of the wall W decreases toward the outlet 2b. More specifically, the wall W changes linearly at the second portion W2 and the third portion W3. This slope structure reduces the width dimension of the wall W from the first portion W1 to the inlet 2a or from the first portion W1 to the outlet 2b.

Figure 7:
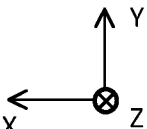

FIG. 7 is a cross-sectional view at line A-A of FIG. 6. When the temperature of crucible 2 is set at or above a melting temperature of the solid material 7, there is concern that the solid material 7 may flow into the inlet 2a or the outlet 2b. Therefore, the position of the top surface of the solid material 7 is lower than the bottom of the inlet 2a, as shown in FIG. 7. Although only the inlet 2a side is shown in FIG. 7, the same relationship is used for the outlet 2b side.

Figure 8:
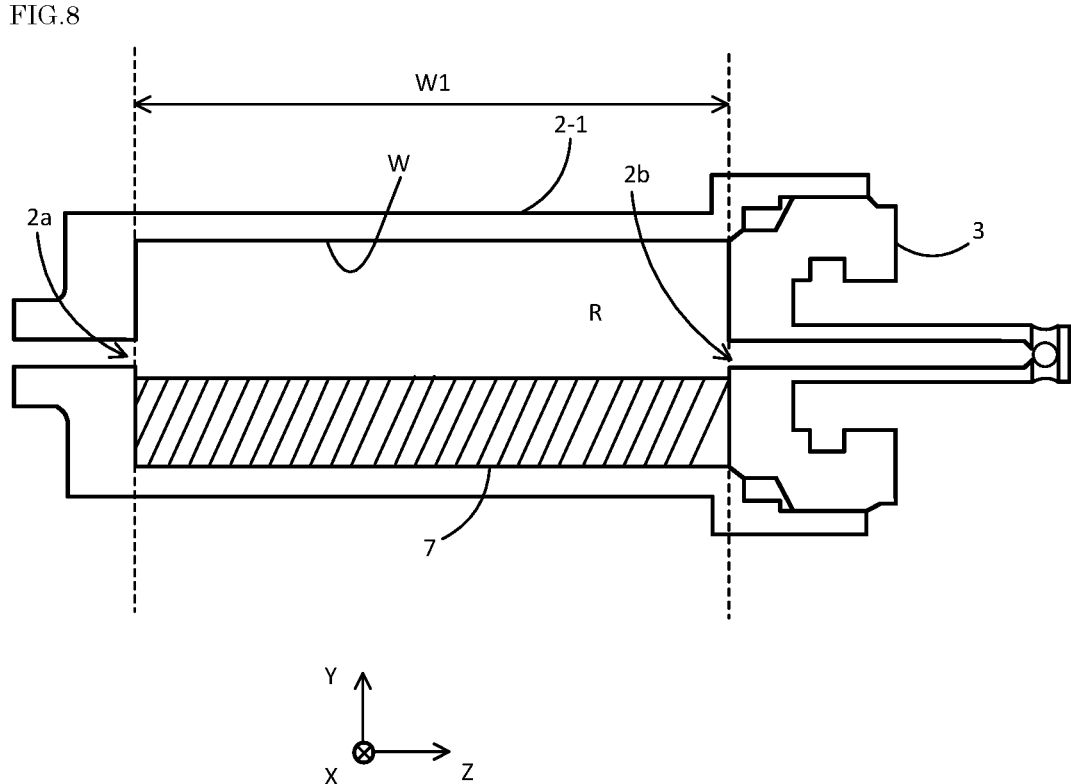
FIGS. 8 and 10 illustrate schematic cross-sectional views of examples of an crucible, for purposes of comparison.

FIG. 8 shows with a comparative example to the crucible 2 of FIG. 6 and FIG. 7. In the crucible 2-1 of FIG. 8, the wall W includes only the first portion W1. When the solid material 7 having the same width with that illustrated in FIG. 6 is placed in the crucible 2-1 of FIG. 8, the dimensions of the solid material 7 are smaller than those of the solid material 7 that may be accommodated in the crucible 2 of FIG. 6. The configuration of the crucible 2 in FIG. 6 allows for a larger solid material 7 to be placed. As the result, a life of vaporizer 1 may be extended.

In FIG. 6, the dimensions of the solid material 7 that may be accommodated in the crucible 2 are smaller than the distance from the bottom of the crucible 2 to the inlet 2a and outlet 2b in the width direction (e.g., the Y-axis direction) of the crucible 2. However, as shown in FIG. 9, the dimensions of the solid material 7 that may be accommodated in the crucible 2 may be larger in the width direction (e.g., the Y-axis direction) of the crucible 2 than the distance from the bottom of the crucible 2 to the inlet 2a or outlet 2b.

The intersection of the second portion W2 and the first portion W1 of the wall W and the intersection of the third portion W3 and the first portion W1 of the wall W limit the movement of the aluminum-containing solid material 7 in the longitudinal direction (e.g., the Z-axis direction) within the crucible 2. The movement of the solid material 7 in the longitudinal direction (e.g., the Z-axis direction) of the crucible 2 is thus restricted by the second portion W2 and third portion W3 of the wall W. Even with such a large arrangement of the solid material 7, operation of the vaporizer 1 can be carried out without hindrance because the solid material 7 does not block the inlet 2a and outlet 2b. In other words, the crucible 2 can keep a flow of the reactive gas and vapor in the crucible 2, in which the reactive gas and vapor may blow into the crucible 2 through the inlet 2a, around the top of the solid material 7, and out through the outlet 2b.

Figure 9:
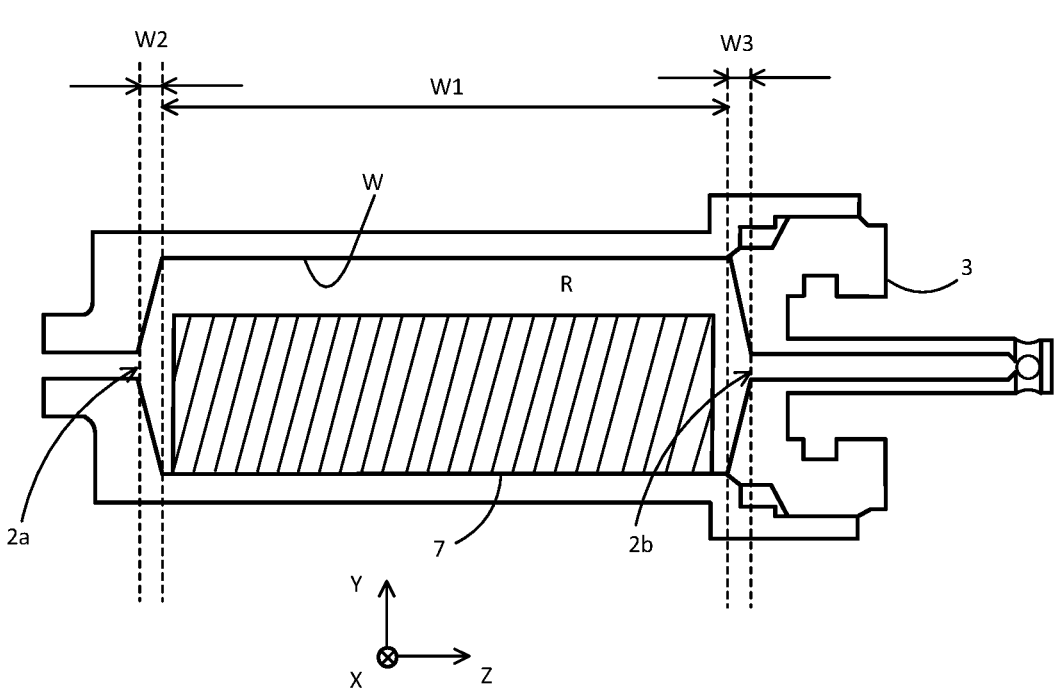
Figure 10:
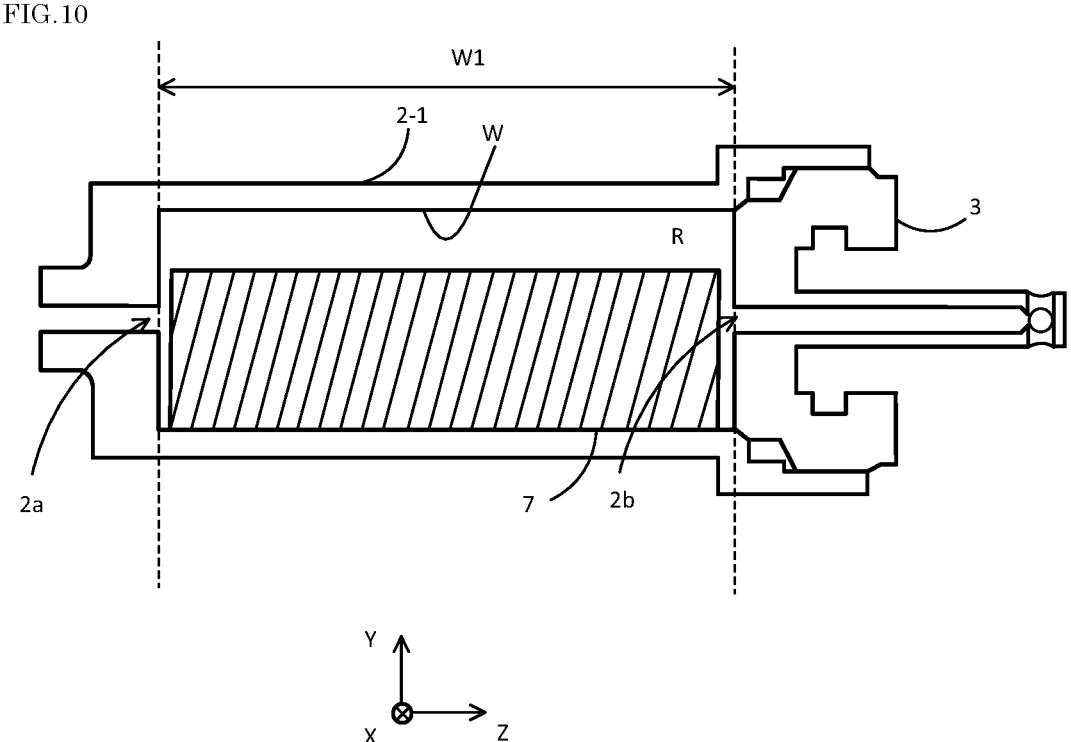

FIG. 10 shows a comparative example to the crucible 2 illustrated in FIG. 9. In the crucible 2-1 of FIG. 10, the solid material 7 having dimensions the same as in FIG. 9 is arranged. The wall W of the crucible 2-1 in FIG. 10 has only of the first portion W1, so there is no part that restricts the movement of the solid material 7 in the longitudinal direction (e.g., the Z-axis direction) of the crucible 2. Therefore, during heating, the solid material 7 may slide longitudinally within the crucible 2 to seal the inlet 2a and outlet 2b, which may interfere with the operation of the vaporizer 1.

Figure 11:
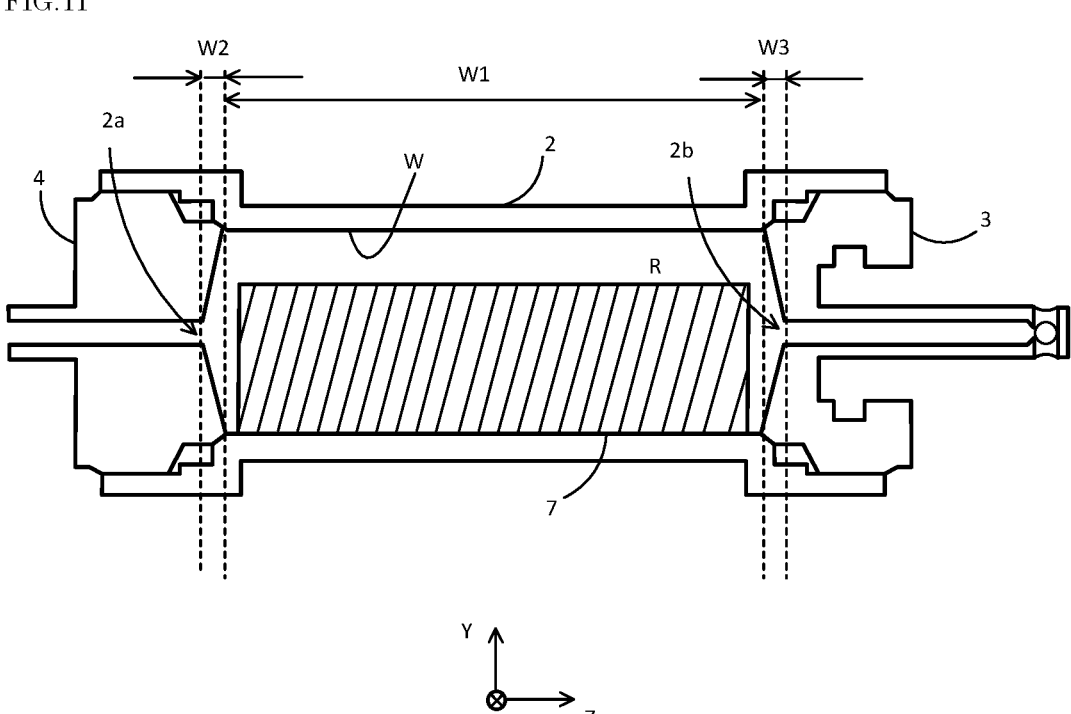
Figure 12:
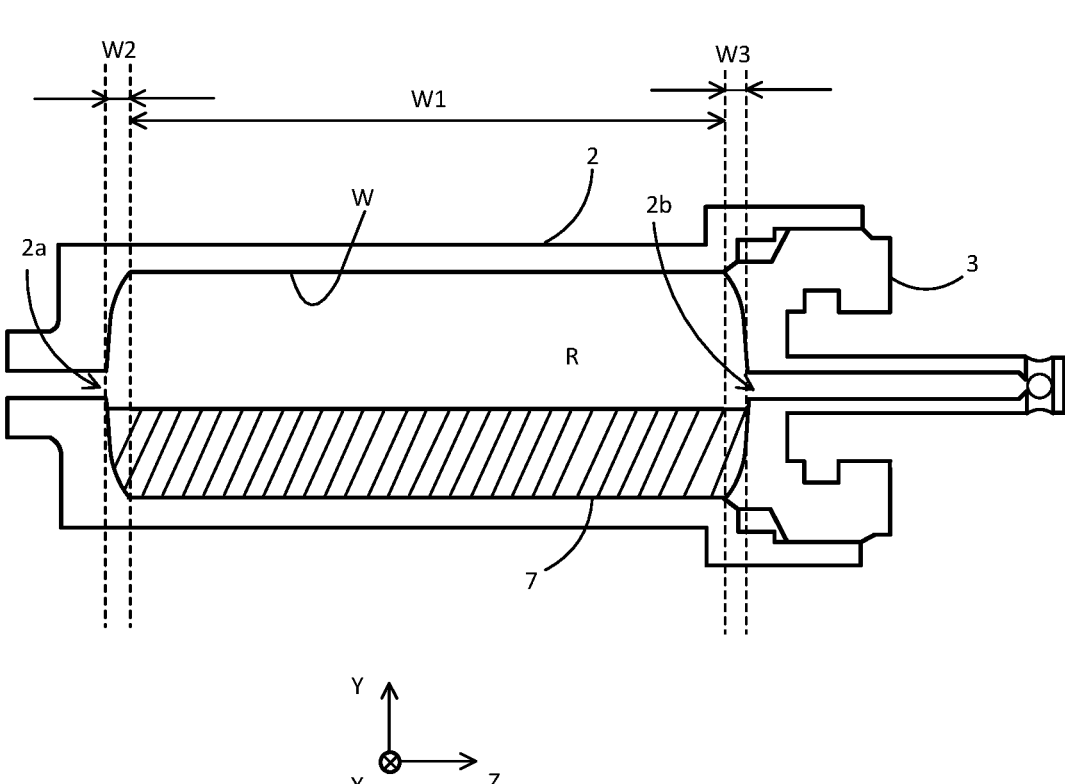
Figure 13:
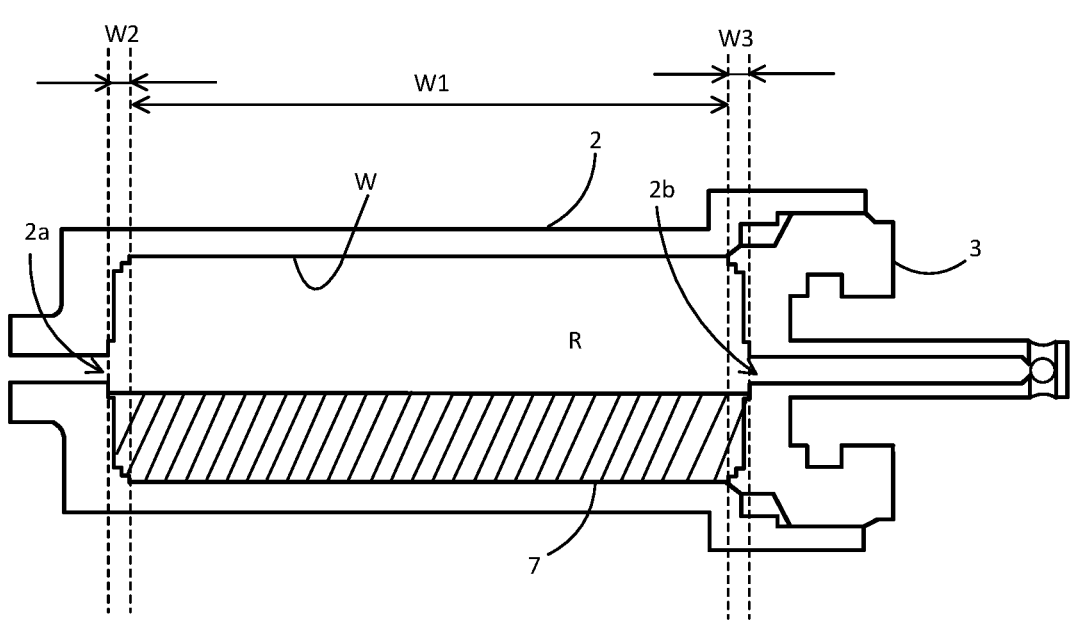
Figure 13:
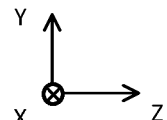

In the crucible 2 shown in FIGS. 1, 6, 7, and 9, the second nozzle 4 and crucible 2 are formed as one piece. As shown in FIG. 11, the second nozzle 4 and the crucible 2 may be provided separately and the second nozzle 4 may be attached to the crucible 2. In this configuration, since the second nozzle 4 also serves as a part of the crucible 2, the wall W forming interior space R of the crucible 2 includes a portion of the crucible 2, a portion of the first nozzle 3 and a portion of the second nozzle 4. In the wall W of the crucible 2 in FIGS. 1, 6, 7, 9, and 11, a linear slope is formed at the second portion W2 and the third portion W3. As other examples of such slope, a curved shape as shown in FIG. 12 or a stair configuration as shown in FIG. 13 may be used.

The slope need not be a straight line, a curve, or a stair, but in some embodiments, the slope may be a combination of any of these. The wall W of crucible 2 in FIGS. 1, 6, 7, 9, and 11-13 has a symmetrical structure at the longitudinal end of crucible 2. However, in some embodiments, asymmetric structures may be used.

Figure 14:
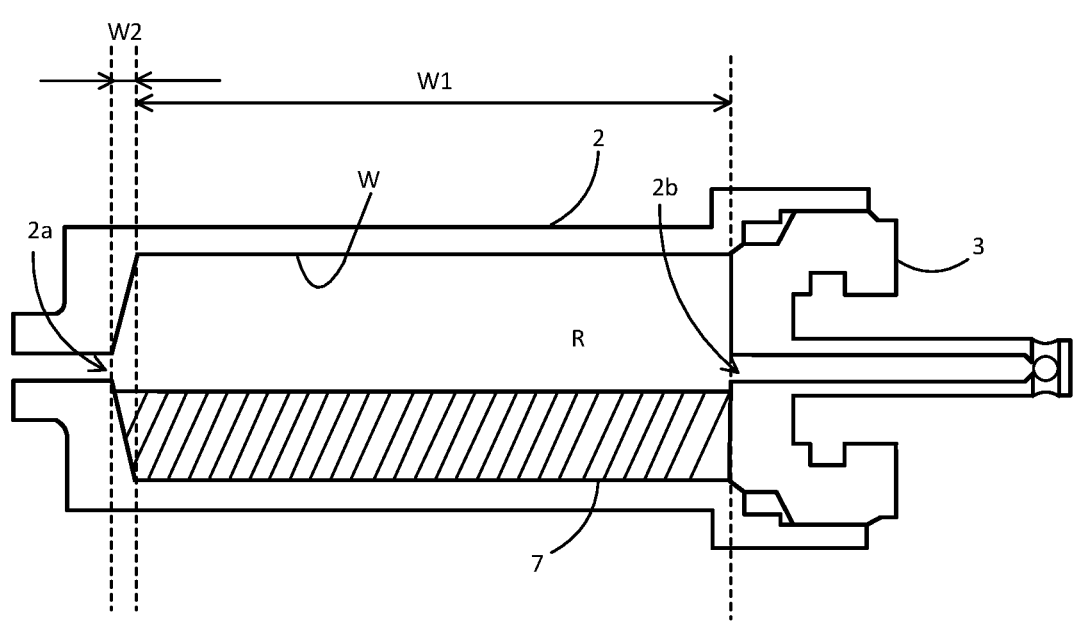
Figure 14:
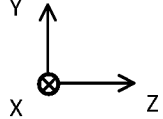
Figure 15:
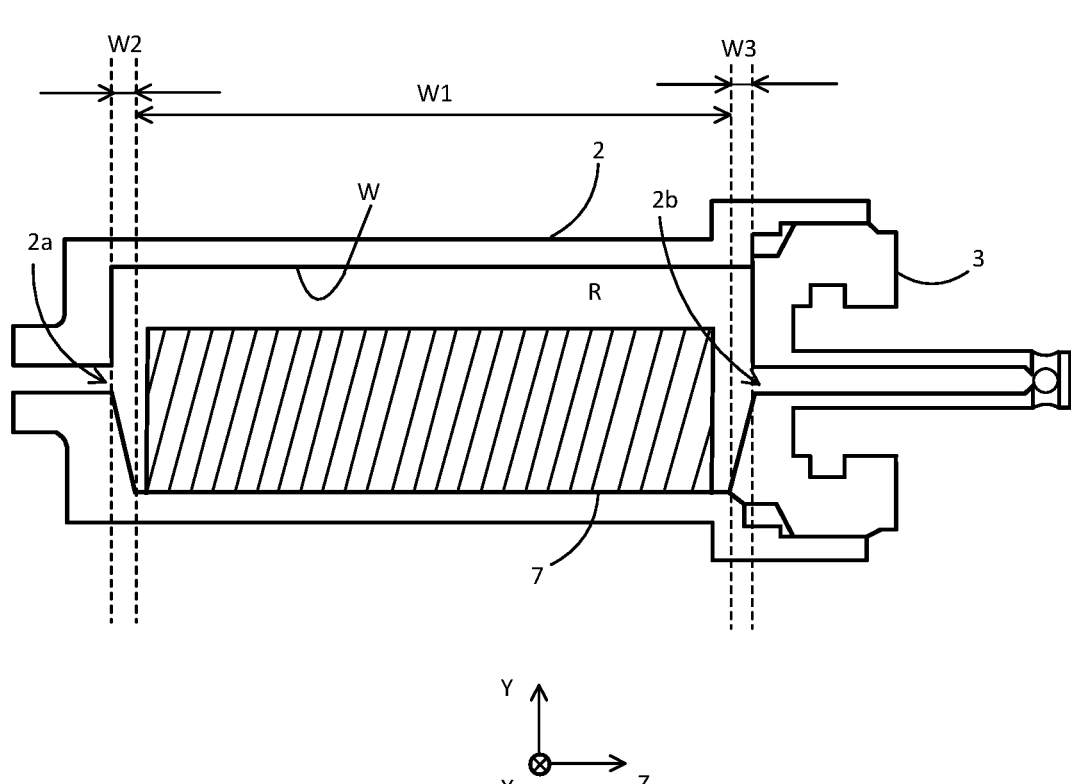

For example, as shown in FIG. 14, the wall W of crucible 2 may have a first portion W1 and a second portion W2 and no third portion W3. Even if the configuration has a third portion W3, the shape of the wall W at the second portion W2 and the third portion W3 can be different. The slope of the wall W at the second portion W2 and the third portion W3 need not be formed throughout. For example, as shown in FIG. 15, a slope structure may be used only on the lower side illustrated, across the inlet 2a and outlet 2b.

Figure 16:
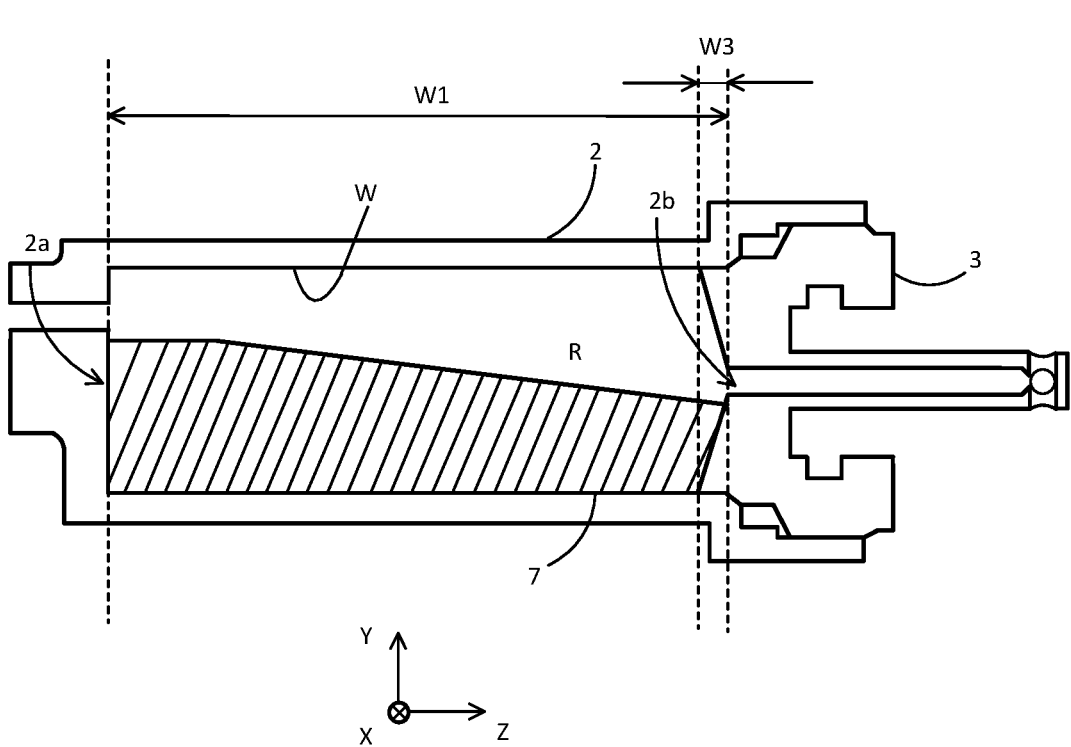

In the some embodiments, the inlet 2a and outlet 2b are arranged side by side along the longitudinal direction of the crucible 2. That is, in some embodiments, the inlet 2a and the outlet 2b are on a same axis. As shown in FIG. 16, the position in which each is placed in the width direction (e.g., the Y-axis direction) of crucible 2 may be different. The aluminum-containing solid material 7 can be powder, pellets, or blocks. Blocks generally facilitate placement when the aluminum-containing solid material 7 is to be placed in a specific location.

The vaporizer may be also used for generating other metal ions, by replacing the solid material 7 with a kind of the solid material like a Titanium, Nickel and/or a compound thereof. Further, a kind of the reactive gas may also be changed.

It should be understood that embodiments are not limited to the various embodiments described above, but various other changes and modifications may be made therein without departing from the spirit and scope thereof as set forth in appended claims.

What is claimed is:

1. A vaporizer comprising:
a crucible configured to receive a solid material; and
a heater that heats the crucible,
wherein the crucible includes:
    a wall forming an interior space of the crucible,
    an inlet connected to the wall that releases a reactive gas into the interior space, and
    an outlet connected to the wall that releases the reactive gas and a vapor of a reaction product generated by a reaction between the solid material and the reactive gas from the interior space, and
    wherein the interior space of the crucible narrows toward at least one of the inlet and or the outlet.

2. The vaporizer as recited in claim 1, wherein the interior space narrows toward both the inlet and the outlet.

3. The vaporizer as recited in claim 1, wherein the wall has a slope structure, thereby narrowing the interior space.

4. The vaporizer as claimed in claim 1, wherein the wall has a symmetric structure.

5. The vaporizer as claimed in claim 1, wherein the crucible is a cylindrical shape and a center axis of the crucible coincides with a line connecting the inlet and the outlet.

6. An ion source comprising:
the vaporizer as recited in claim 1,
an arc chamber that generates a plasma from the vapor supplied from the vaporizer, and
an extraction electrode that extracts an ion beam from the plasma.

7. A vaporizer comprising:
a crucible configured to receiving a solid material, the crucible comprising an inlet for receiving a reactive gas into the crucible, an outlet through which the reactive gas and vapor are released from the crucible, and a wall that connects the inlet to the outlet; and
a heater that heats the crucible,
wherein:
    a first portion of the wall extends in parallel to a direction connecting the inlet and the outlet,
    a second portion of the wall connects the first portion to the inlet,
    a third portion of the wall connects the first portion to the outlet, and
    at least one of a dimension of the second portion decreases toward the inlet or a dimension of the third portion decreases toward the outlet.

8. The vaporizer as claimed in claim 7, wherein the second portion of the wall is sloped from the first portion to the inlet.

9. The vaporizer as claimed in claim 8, wherein the third portion of the wall is sloped from the first portion to the outlet.

10. The vaporizer as claimed in claim 7, wherein the third portion of the wall is sloped from the first portion to the outlet.

11. The vaporizer as claimed in claim 7, wherein the dimension of the second portion is a diameter of the second portion, and the dimension of the third portion is a diameter of the third portion.

12. The vaporizer as claimed in claim 7, wherein the dimension of the second portion decreases toward the inlet and the dimension of the third portion decreases toward the outlet.

13. The vaporizer as claimed in claim 12, wherein the dimension of the second portion is a diameter of the second portion, and the dimension of the third portion is a diameter of the third portion.

14. An ion source comprising:
the vaporizer as recited in claim 7,
an arc chamber that generates a plasma from the vapor supplied from the vaporizer, and
an extraction electrode that extracts an ion beam from the plasma.

* * * * *